United States Patent
Burr et al.

[19]

[11] Patent Number: 5,942,781
[45] Date of Patent: Aug. 24, 1999

[54] TUNABLE THRESHOLD SOI DEVICE USING BACK GATE WELL

[75] Inventors: James B. Burr, Foster City, Calif.; Theodore W. Houston, Richardson, Tex.

[73] Assignees: Sun Microsystems, Inc., Palo Alto, Calif.; Texas Instruments, Inc., Dallas, Tex.

[21] Appl. No.: 09/092,973

[22] Filed: Jun. 8, 1998

[51] Int. Cl.[6] .................................................. H01L 27/01
[52] U.S. Cl. ........................ 257/347; 257/392; 257/901
[58] Field of Search .................................. 257/347, 345, 257/392, 355, 356, 357, 597, 510, 384, 358, 362, 361, 360, 601, 548, 901, 299, 344, 316, 408

[56] References Cited

U.S. PATENT DOCUMENTS

| | | | |
|---|---|---|---|
| 5,001,528 | 3/1991 | Bahraman | 257/347 |
| 5,166,765 | 11/1992 | Lee et al. | 257/345 |
| 5,614,433 | 3/1997 | Mandelman | 438/349 |
| 5,629,544 | 5/1997 | Voldman et al. | 257/355 |
| 5,773,863 | 6/1998 | Burr et al. | 257/344 |
| 5,818,099 | 10/1998 | Burghartz | 257/548 |

*Primary Examiner*—Carl Whitehead, Jr.
*Attorney, Agent, or Firm*—Jones Volentine, LLP

[57] ABSTRACT

A fully depleted SOI device includes a semiconductor substrate and a conductive well of a first conductivity type formed in a principal surface of the semiconductor substrate. An insulating layer is formed along the principal surface of the semiconductor substrate and extends across the conductive well. A transistor is formed on the insulating layer such that the insulating layer is interposed between the transistor and the semiconductor substrate, with the transistor including source and drain regions of the first conductivity type formed on the insulating layer, a channel region of a second conductivity type formed on the insulating layer and aligned over the conductive well, and a gate electrode aligned over the channel region. A metal contact is connected to the conductive well for applying a reverse bias potential to the transistor.

8 Claims, 3 Drawing Sheets

TUNABLE THRESHOLD SOI DEVICE USING BACK GATE WELL

BACKGROUND OF THE INVENTION

1. Field of the Invention

The present invention generally relates to semiconductor devices, and in particular, the present invention relates to a fully depleted silicon-on-insulator (SOI) device which includes a mechanism for tuning the threshold voltage thereof.

2. Description of the Related Art

Silicon-on-insulator (SOI) devices are characterized by structures in which the Si device layers are formed over an insulating film. FIG. 1 illustrates an exemplary configuration of such a device.

The device of FIG. 1 includes an nfet 102 and a pfet 104 formed within a layer 106. The layer 106 is located along an oxide layer 108 formed atop a p+ bulk material 110. The nfet 102 includes source and drain n-regions 112 and 114, a p-region 116, and a gate electrode 118. Likewise, the pfet 104 includes source and drain p-regions 120 and 122, an n-region 124, and a gate electrode 126. SOI devices of this type are characterized by low parasitic capacitances, as well as high dielectric isolation of the on-chip components.

A "partially depleted" SOI device refers to a structure in which the depletion region of the transistors does not extend all the way down to the oxide layer 108. An example of this is shown in FIG. 2. Here, the silicon layer 206 is of sufficient thickness and the n-regions 212 and 214 are appropriately configured (e.g., through use of source-drain extensions) such that the depletion region 228 is spaced from the upper surface of the oxide layer 208, i.e., only a portion of the p-region 216 is depleted.

A mechanism is known in the art for reducing thresholds in partially depleted SOI devices. Referring again to FIG. 2, a body contact 230 is embedded in the p-region 216, below the depletion region 228. Also, as shown, the body contact 230 is electrically tied to the gate electrode 218. As such, when the gate potential is turned on, the potential of the p-region 216 below the depletion region 228 (i.e., the "bulk region") is pulled up, whereby the bulk potential of the device tracks the gate potential. This results in a forward biasing of the bulk which in turn decreases the threshold voltage of the device.

A "fully depleted" SOI device is shown in FIG. 3. Here, the device is configured such that the depletion regions 328 extended completely down to the interface with the oxide layer 308. This is done, for example, by making the layer 306 much thinner than the corresponding layer 206 of the partially depleted device shown in FIG. 2. The structure is otherwise similar to that of the partially depleted device, and includes an nfet 302 having source and drain n-regions 312 and 314, a p-type channel region 316, and a gate 318, and a pfet 304 having source and drain p-regions 320 and 322, an n-type channel region 324, and a gate 326. The substrate 310 is tied to a fixed potential such as ground.

There are a number of factors which contribute to the magnitude of an SOI device's threshold voltage. For example, to set a device's threshold voltage near zero, light doping and/or counter doping in the channel region of the device may be provided. However, due to processing variations, the exact dopant concentration in the channel region can vary slightly from device to device. Although these variations may be slight, they can shift a device's threshold voltage by a few tens or even hundreds of milli-volts. Further, dimensional variations, charge trapping in the materials and interfaces, and environmental factors such as operating temperature fluctuations can shift the threshold voltage. Still further, low threshold devices may leak too much when their circuits are in a sleep or standby mode. Thus, particularly for low-threshold devices, it is desirable to provide a mechanism for tuning the threshold voltage to account for these and other variations.

In this regard, it is noted that the partially depleted structure can be made tunable by providing isolated ohmic contacts between the bulk 216 and to the gate 218 shown in FIG. 2. For example, by monitoring leakage of a test transistor, the bias potential of the bulk material can be dynamically adjusted to maintain the desired threshold voltage. This approach, however, is not feasible in the fully depleted structure since the depletion region extends fully to the oxide layer, thus "greatly reducing the influence a voltage applied to a body contact has on the threshold voltage." Moreover, as the p+ substrate (reference numeral 310 in FIG. 3) extends fully beneath both the nfets and the pfets, adjusting the potential of the p+ substrate is not an effective means for tuning the threshold voltages of the devices. That is, there is no practical way in the structure of FIG. 3 to electrically isolate the respective bias potentials applied to nfets and pfets.

To overcome this problem, the SOI AS structure shown in FIG. 4 has been proposed. This device is characterized by the insertion of an insulative layer 430 of poly-silicon between oxide layers 408a and 408b, with the oxide layer 408b being formed over the p+ substrate 410. Using masking techniques, the poly-silicon is selectively doped to form conductive regions 432 and 434 beneath the nfet 402 (having n-type source and drains regions 412 and 414, a p-type channel region 416, and a gate 418) and the pfet 404 (having p-type source and drains regions 420 and 422, an n-type channel region 424, and a gate 426), respectively. Since the poly-silicon is an insulator, the conductive regions 432 and 434 are electrically isolated. By providing isolated contacts 436 and 438 in the conductive regions 432 and 434, respectively, separate bias potentials can be applied to the nfet 402 and pfet 404, thereby tuning the threshold voltage of each device. The primary drawback of this approach, however, resides in the fact that an extra layer (i.e., the poly-silicon layer 430) must be fabricated in the device.

Another configuration that has been proposed is shown in FIG. 5. Here, a first buried back gate p+ well 540 is formed within a p− substrate 510 beneath the nfet 518 (having n-type source and drain regions 512 and 514, a p-type channel region 516, and a gate 518), and a second buried back gate n+ well 542 is formed within the p− substrate beneath the pfet 504 (having p-type source and drains regions 520 and 522, an n-type channel region 524, and a gate 526). By providing separate contacts 544 and 546 in the conductive regions 540 and 542, respectively, separate bias potentials can be applied to the nfet 402 and pfet 404, thereby tuning the threshold voltage of each device. This approach has the advantage of avoiding the extra layers needed for the SOI AS structure, but suffers the drawback that it is only possible to decrease the threshold voltages slightly before forward biasing the p-n junction between the nfet and pfet back-gate wells, and thus the configuration of FIG. 4 cannot significantly reduce the threshold voltage. This is particularly disadvantageous for low threshold devices in which it is desired to maintain the threshold voltage to an extremely low value.

SUMMARY OF THE INVENTION

It is an object of the present invention to provide a mechanism for reducing thresholds of fully depleted SOI devices using buried well regions, in particular for low-threshold applications, without the provision of an extra layer in the SOI oxide.

To achieve the above and other objects and advantages, according to one aspect of the present invention, a fully depleted SOI device is presented which includes a semiconductor substrate; a conductive well of a first conductivity type formed in a principal surface of the semiconductor substrate; an insulating layer formed along the principal surface of the semiconductor substrate and extending across the conductive well; a transistor formed on the insulating layer such that the insulating layer is interposed between the transistor and the semiconductor substrate, the transistor including source and drain regions of the first conductivity type formed on the insulating layer, a channel region of a second conductivity type formed on the insulating layer and aligned over the conductive well, and a gate electrode aligned over the channel region; and a metal contact connected to the conductive well for applying a reverse bias potential to the transistor.

According to another aspect of the invention, a fully depleted SOI device is presented which includes a semiconductor substrate; a first conductive well of a first conductivity type formed in a principal surface of the semiconductor substrate; a second conductive well of a second conductivity type formed in the principal surface of the semiconductor substrate and spaced from the first conductive well; an insulating layer formed along the principal surface of the semiconductor substrate and extending across the first and second conductive wells; a first transistor formed on the insulating layer such that the insulating layer is interposed between the first transistor and the semiconductor substrate, the first transistor including first source and drain regions of the first conductivity type formed on the insulating layer, a first channel region of the second conductivity type formed on the insulating layer and aligned over the first conductive well, and a first gate electrode aligned over the first channel region; a second transistor formed on the insulating layer such that the insulating layer is interposed between the second transistor and the semiconductor substrate, the second transistor including second source and drain regions of the second conductivity type formed on the insulating layer, a second channel region of the first conductivity type formed on the insulating layer and aligned over the second conductive well, and a second gate electrode aligned over the second channel region; a first ohmic contact connected to the first conductive well for applying first reverse bias potential to the first transistor; and a second ohmic contact connected to the second conductive well for applying a second reverse bias potential to the second transistor.

According to still another aspect of the present invention, the first conductive well is an n+ type well and the second conductive well is a p+ type well, and the first transistor is an nFET and the second transistor is a pFET.

According to yet another aspect of the present invention, a first reverse bias potential of about +1 volt reduces a threshold of the nFET transistor from about +350 to +400 millivolts to about zero millivolts, and a second reverse bias potential of about −1 volt reduces a threshold of the pFET transistor from about −350 to −400 millivolts to about zero millivolts.

DETAILED DESCRIPTION OF THE PREFERRED EMBODIMENTS

The configuration of the present invention provides a mechanism which reverse biases and tunes the threshold of the fully depleted SOI device, in particular for low-threshold applications, without the provision of an extra layer in the SOI oxide.

Figure 1:
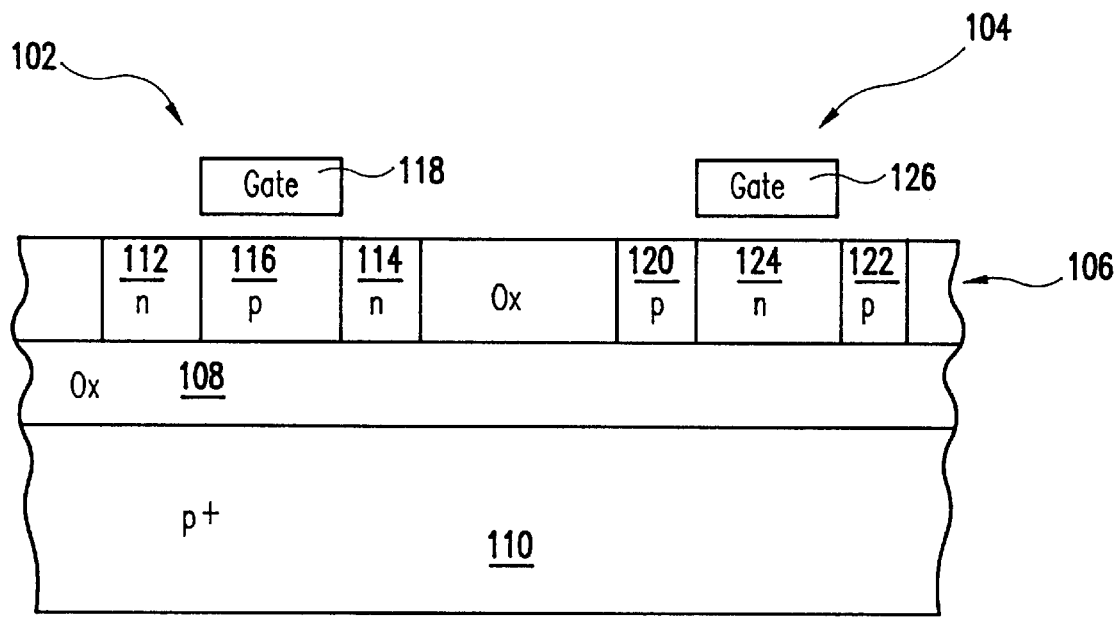
FIG. 1 depicts a typical silicon-on-insulator (SOI) configuration.
Figure 2:
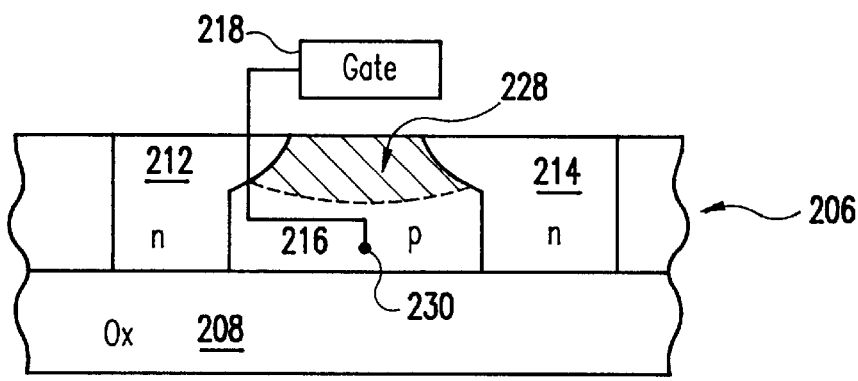
FIG. 2 illustrates a partially depleted dynamic threshold SOI structure.
Figure 3:
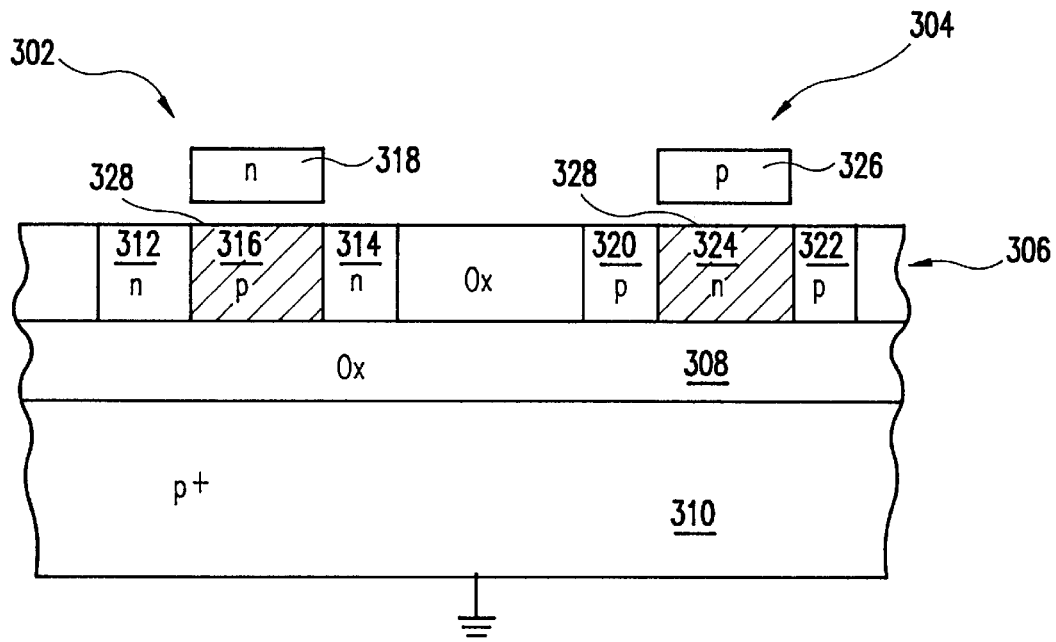
FIG. 3 illustrates a fully depleted SOI structure.
Figure 4:
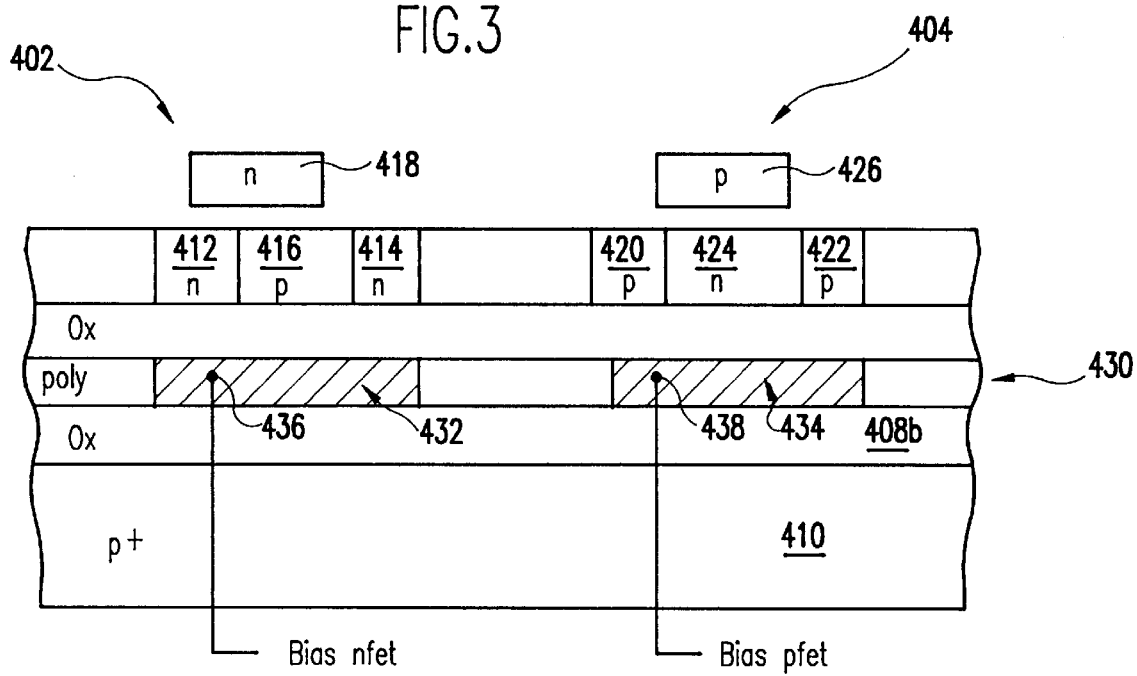
FIG. 4 illustrates a fully depleted SOI AS structure.
Figure 5:
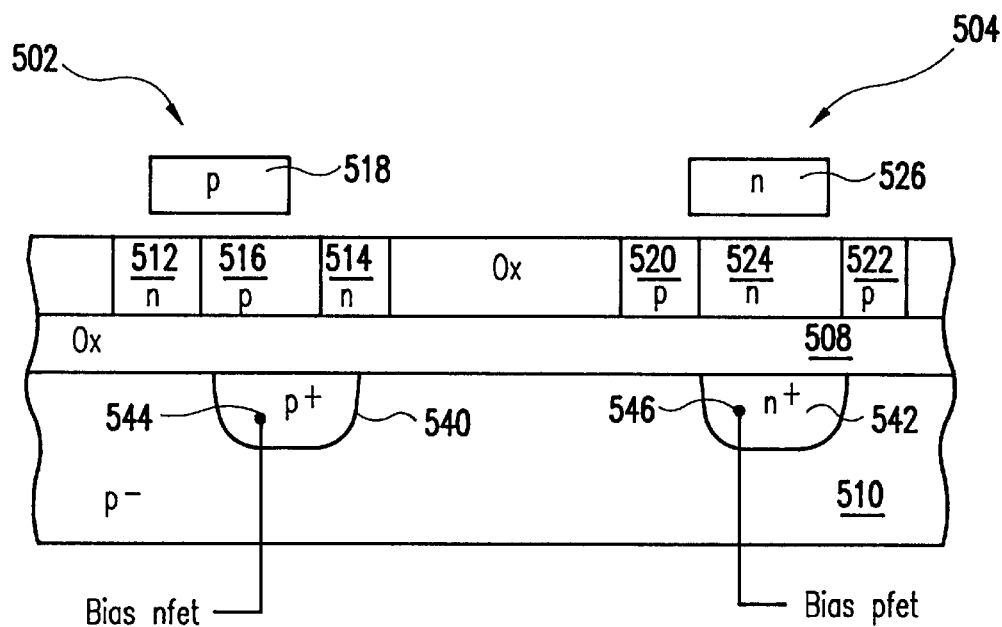
FIG. 5 illustrates a fully depleted SOI structure including a back-gate well which forward biases the transistor devices.
Figure 6:
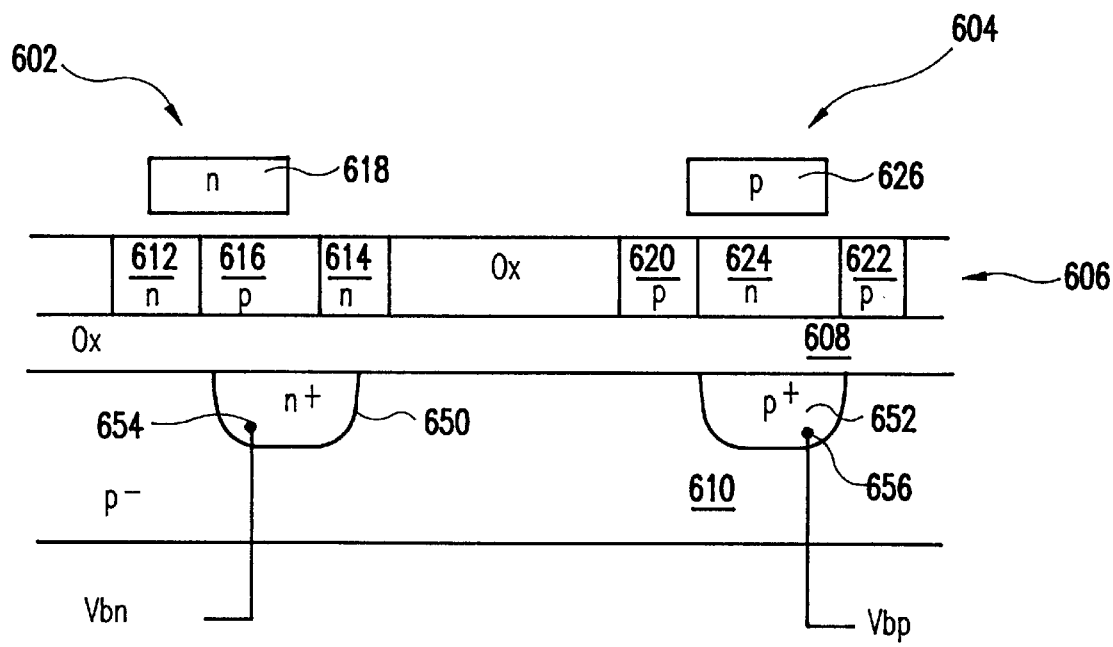
FIG. 6 illustrates a fully depleted SOI structure including a back-gate well according to the present invention.

FIG. 6 illustrates a configuration of an exemplary embodiment of the present invention. The SOI device shown includes an nfet 602 and a pfet 604 formed generally along a layer 606. The nfet 602 is made up of n-type source and drain regions 612 and 614, a p-type channel region 616, and a gate electrode 618. Likewise, the pfet 604 includes p-type source and drain regions 620 and 622, an n-type channel region 624, and a gate electrode 626. The nfet 602 and pfet 604 are formed on an insulating layer 608 (e.g. an oxide layer), which is in turned formed atop an intrinsic p− substrate 610.

Also, aligned beneath the p-region 616 of the nfet 602, an n+ well 650 is formed within the p− substrate 610. The n+ region is electrically coupled to a bias contact 654, which in turn receives a bias potential Vbn for reverse biasing the nfet 602. Likewise, aligned beneath the n-region 624 of the pfet 604, an p+ well 652 is formed within the p− substrate 610. The p+ region is electrically coupled to a bias contact 656, which in turn receives a bias potential Vbp for reverse biasing the pfet 604. Separate reverse bias potentials can be readily applied to the nfet 602 and pfet 604, thereby tuning the threshold voltage of each device.

Further, unlike the structure described earlier, the configuration of FIG. 6 allows tuning to be effected by reducing the threshold voltages of the devices. This in turn allows for the configuration to be readily adopted in low-threshold applications. For example, in standard SOI, the threshold adjust implant typically sets the threshold voltage Vt to around 350 to 400 millivolts (mV). The table below shows the threshold tuning effects of the bias potentials applied to the SOI nfet and pfet of the present invention.

| nFET | | pFET | |
|---|---|---|---|
| Bias potential | Threshold voltage | Bias potential | Threshold voltage |
| 0.0 V | +0.4 V | 0.0 V | −0.4 V |
| +1.0 V | 0.0 V | −1.0 V | 0.0 V |

As shown in the table above, the present invention thus provides a mechanism for reducing the device threshold voltage to zero or near zero volt levels.

The buried wells 650 and 652 can be fabricated by way of high energy deep implants through the silicon layer 606 and insulating layer 608. Typically, the well structures will span tens to hundreds of transistors or more, and thus the design rules or boundaries can be made much larger than those of individual devices. Also, as an alternative to deep implants, the wells 650 and 652 can be formed at the surface of the substrate, and thereafter the insulating layer 608 and silicon layer 606 can be successively formed atop the substrate surface.

The present invention has been described by way of specific exemplary embodiments, and the many features and advantages of the present invention are apparent from the written description. Thus, it is intended that the appended claims cover all such features and advantages of the invention. Further, since numerous modifications and changes will readily occur to those skilled in the art, it is not desired to limit the invention to the exact construction and operation as illustrated and described. Hence all suitable modifications and equivalents may be resorted to as falling within the scope of the invention.

What is claimed is:

1. An SOI device comprising:

a semiconductor substrate;

a conductive well of a first conductivity type formed in a principal surface of said semiconductor substrate;

an insulating layer formed along said principal surface of said semiconductor substrate and extending across said conductive well;

a transistor formed on said insulating layer such that said insulating layer is interposed between said transistor and said semiconductor substrate, said transistor including source and drain regions of the first conductivity type formed on said insulating layer, a channel region of a second conductivity type formed on said insulating layer and situated over said conductive well, and a gate electrode insulatively disposed over said channel region; and an ohmic contact connected to said conductive well for applying a reverse bias potential to said transistor.

2. A fully depleted SOI device as claimed in claim 1, wherein said conductive well is an n+ type well, and wherein said transistor is an nFET.

3. A fully depleted SOI device as claimed in claim 2, wherein a reverse bias potential of about +1 volt reduces a threshold of said transistor from about +350 to +400 millivolts to about zero millivolts.

4. A fully depleted SOI device as claimed in claim 1, wherein said conductive well is a p+ type well, and wherein said transistor is a pFET.

5. A fully depleted SOI device as claimed in claim 4, wherein a reverse bias potential of about −1 volt reduces a threshold of said transistor from about −350 to −400 millivolts to about zero millivolts.

6. An SOI device comprising:

a semiconductor substrate;

a first conductive well of a first conductivity type formed in a principal surface of said semiconductor substrate;

a second conductive well of a second conductivity type formed in said principal surface of said semiconductor substrate and spaced from said first conductive well;

an insulating layer formed along said principal surface of said semiconductor substrate and extending across said first and second conductive wells;

a first transistor formed on said insulating layer such that said insulating layer is interposed between said first transistor and said semiconductor substrate, said first transistor including first source and drain regions of the first conductivity type formed on said insulating layer, a first channel region of the second conductivity type formed on said insulating layer and situated over said first conductive well, and a first gate electrode insulatively disposed over said first channel region;

a second transistor formed on said insulating layer such that said insulating layer is interposed between said second transistor and said semiconductor substrate, said second transistor including second source and drain regions of the second conductivity type formed on said insulating layer, a second channel region of the first conductivity type formed on said insulating layer and situated over said second conductive well, and a second gate electrode insulatively disposed over said second channel region;

a first ohmic contact connected to said first conductive well for applying first reverse bias potential to said first transistor; and a second ohmic contact connected to said second conductive well for applying a second reverse bias potential to said second transistor.

7. A fully depleted SOI device as claimed in claim 6, wherein said first conductive well is an n+ type well and said second conductive well is a p+ type well, and wherein said first transistor is an nFET and said second transistor is a pFET.

8. A fully depleted SOI device as claimed in claim 6, wherein a first reverse bias potential of about +1 volt reduces a threshold of said first transistor from about +350 to +400 millivolts to about zero millivolts, and wherein a second reverse bias potential of about −1 volt reduces a threshold of said second transistor from about −350 to −400 millivolts to about zero millivolts.

* * * * *